(12) United States Patent
Li et al.

(10) Patent No.: US 7,521,930 B2
(45) Date of Patent: Apr. 21, 2009

(54) METHOD AND APPARATUS FOR ACCELERATING MAGNETIC RESONANCE TEMPERATURE IMAGING

(75) Inventors: Guo Bin Li, Shenzhen (CN); Yiu-Cho Chung, Columbus, OH (US); Qiang Zhang, Shenzhen (CN); Xiao Dong Zhou, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/056,607

(22) Filed: Mar. 27, 2008

(65) Prior Publication Data

US 2008/0238423 A1   Oct. 2, 2008

(30) Foreign Application Priority Data

Mar. 29, 2007   (CN) ................... 2007 1 0064914

(51) Int. Cl.
  *G01V 3/00* (2006.01)
(52) U.S. Cl. .................................................. 324/315
(58) Field of Classification Search ......... 324/300–322; 600/410–435
  See application file for complete search history.

(56) References Cited

U.S. PATENT DOCUMENTS

| 5,307,812 | A  | * | 5/1994 | Hardy et al. ............. 600/411 |
| 5,323,779 | A  | * | 6/1994 | Hardy et al. ............. 600/411 |
| 5,327,884 | A  | * | 7/1994 | Hardy et al. ............. 600/411 |
| 2004/0030227 | A1 | * | 2/2004 | Littrup et al. ............. 600/300 |
| 2008/0058634 | A1 | * | 3/2008 | Roland et al. ............. 600/411 |
| 2008/0194941 | A1 | * | 8/2008 | Steinmeyer et al. ........ 600/411 |
| 2008/0275330 | A1 | * | 11/2008 | Mu et al. .................... 600/411 |

\* cited by examiner

*Primary Examiner*—Dixomara Vargas
(74) *Attorney, Agent, or Firm*—Schiff Hardin LLP

(57) ABSTRACT

In a method and apparatus for accelerating MR temperature imaging used in MR-monitored high intensity focused ultrasound (HIFU) therapy, temperature changes are determined at the focus of the ultrasound during MR temperature imaging; determining the ideal acceleration rate needed for data sampling according to the temperature changes at said focus is determined, the variable-density (VD) data sampling in k-space is adjusted according to the determined ideal acceleration rate, and the data obtained from sampling are reconstructed to form an image. The capability of accelerating MR temperature imaging with both good temporal resolution and good spatial resolution is improved by determining the acceleration rate according to temperature changes at the ultrasound focus and by adjusting the VD data sampling of k-space and thereby the benefits of good flexibility, feasibility and stability are achieved.

16 Claims, 5 Drawing Sheets

METHOD AND APPARATUS FOR ACCELERATING MAGNETIC RESONANCE TEMPERATURE IMAGING

BACKGROUND OF THE INVENTION

1. Field of the Invention

The present invention involves magnetic resonance imaging (MRI) technology, and more particularly a method and an apparatus for accelerating the magnetic resonance (MR) temperature imaging.

2. Description of the Prior Art

In an MR-monitored high intensity focused ultrasound (HIFU) therapy system, a HIFU transducer, i.e. HIFU therapy head, emits focused ultrasonic waves into the human body while through therapy water to increase the local temperature of the body part to be treated, hence achieving the desired therapeutic results.

There are three issues inherent with MR temperature imaging: temporal averaging effect, temporal resolution and spatial averaging effect. These issues must be fully considered in the design of an acceleration solution for MR temperature imaging.

Usually, it takes a long time to acquire data to be entered into k-space and the acquisition of data sufficient to generate only one MR image may take several seconds. During the data sampling, the temperature around the heating focus will change continuously, so the temperature is changing continuously while data entered into different points of k-space are acquired. The final temperatures obtained from the reconstructed images are approximations of all the actual temperatures in the course of sampling, which is referred to as the temporal averaging effect. FIG. 1 is an illustration of the temporal averaging effect. The round spot shown in FIG. 1 is the temperature value measured from the rebuilt images, and the curve is the plotting of temperature changes over the acquisition time of one image. Typically, the measured value is closer to the value acquired at the center of k-space.

In order to improve spatial resolution while maintaining the size of the FOV (field of view), more phase encoding steps are needed, leading to more time for acquiring all data of k-space. The temporal resolution is defined as a reciprocal of the time span for acquiring the centers of two sequential k-space matrices. The longer it takes to fill a single k-space matrix, the poorer the temporal resolution is, making it difficult to capture the fast changes of temperature. FIG. 2 shows the impact of temporal resolution on capturing the temperature changes. The curves shown in the FIG. 2 represent the temperature changes and the round spot represents sampling points. Referring to FIG. 2, the temporal resolution shown in the left curve is relatively low and so the data of peak temperature values are lost due to the low temporal resolution while in the right curve, the peak temperature value is acquired as a result of the high temporal resolution.

Each pixel of the MR image represents a voxel of a certain size of the object. The signals of a pixel are the sum or integral of multiple tiny signals in a corresponding voxel. In thermal ablation, if the size of a single voxel is approximately the size of the heating focus, the spatial gradient of temperature will be significant, resulting in the elimination of phases, which in turn leads to distortion of temperature measurement. FIG. 3 is a schematic illustration of the temporal averaging effect. At the left of FIG. 3, the voxels at the focuses are indicated by the arrows. In the middle of FIG. 3, the signal of pixels corresponding to the focus in the rebuilt images is shown. At the right of FIG. 3, shows the actual signal of the focus is shown. As shown in FIG. 3, because the pixel size is only slightly larger than the size of the focus of the ultrasound, there is a significant difference between the signals of the corresponding pixels in the rebuilt images and the actual signals of the ultrasonic focus. The spatial resolution is defined as the reciprocal of voxel dimension. There is a need to improve the spatial resolution of accurate temperature imaging.

Generally speaking, temporal resolution and spatial resolution contradict each other and it is impossible to improve temporal resolution and spatial resolution at the same time. For a given FOV, the smaller spatial resolution requires a longer acquisition time, making the temporal resolution worse not better. Therefore, it is necessary to balance these two parameters.

With existing several parallel imaging technologies, acceleration is achieved by regularly reducing the phase encoding lines and then recovering the lost data with post processing, to improve either temporal resolution or spatial resolution. It is impossible to have a better temporal resolution and a better spatial resolution at the same time. These methods have two drawbacks. First, the acceleration rates achieved by these parallel imaging technologies are usually relatively fixed discrete values and changes of acceleration factors will cause significant fluctuation in image quality. A second problem is instability, namely, misalignment of coil units for parallel imaging or improper positioning of the object may cause serious residual artifacts in the rebuilt images and covering of the heating focus by the residual artifacts will cause significant errors in calculation of temperatures, leading to very serious consequences of the HIFU therapy.

SUMMARY OF THE INVENTION

An object of the present invention is to provide a method for accelerating the MR temperature imaging to achieve MR temperature imaging with both good temporal resolution and good spatial resolution.

Another object of the present invention is to provide an appropriate apparatus for use with the above method for accelerating MR temperature imaging.

These objects are achieved in accordance with the present invention by a method for accelerating MR temperature imaging used in MR-monitored high intensity focused ultrasound (HIFU) therapy, including the steps of determining temperature changes at the focus of the ultrasound during MR temperature imaging, determining the ideal acceleration rate needed for data acquisition according to the temperature changes at the focus, adjusting the variable-density (VD) data sampling of k-space according to the determined ideal acceleration rate, and reconstructing the data acquired from sampling to generate temperature images.

In an embodiment of the invention, the determination of the ideal acceleration rate needed for data acquisition according to the temperature changes includes determining a higher rate to use as the ideal acceleration rate when the temperature is changing quickly, and determining a lower rate to use as the ideal acceleration rate when the temperature is changing slowly.

In a further embodiment of the invention, k-space is divided into a number of segments in the same direction as the phase encoding and said adjustment of the variable-density data sampling of k-space according to the determined ideal acceleration rate comprises: adjusting the segmentation of k-space for variable-density sampling as well as the acceleration factor for each segment according to the determined ideal acceleration rate.

In another embodiment of the invention, the adjustment of the segmentation of k-space for variable-density sampling as well as the acceleration factor for each segment according to the determined ideal acceleration rate includes: reducing the size of the segments with lower acceleration factors and/or increasing the acceleration factors for the outer segments when the temperature is changing quickly, and increasing the size of segments with lower acceleration factors and/or reducing the acceleration factors for the outer segments when the temperature is changing slowly.

In a further embodiment of the invention, the adjustment of the variable-density data sampling of k-space according to the determined ideal acceleration rate comprises: if the same ideal acceleration rate is applied in multiple sequential frames, performing alternate sampling of the phase encoding lines in the multiple sequential frames.

The method can include applying an Inverse Discrete Fourier Transform in the frequency encoding direction of k-space, and selecting the phase encoding lines which contain the area of interest for rebuilding before reconstructing the data acquired from sampling; and rebuilding the data acquired from sampling the phase encoding lines in the area of interest.

The reconstruction of the data acquired from sampling can proceed using the echo sharing technique or iterative K-t techniques.

The echo sharing technique or iterative K-t techniques to reconstruct the data acquired from sampling according to the imaging requirements can include using the iterative K-t technique to reconstruct the data acquired from sampling when the thermal dose estimation is required and using both the echo sharing technique and the iterative K-t technique to reconstruct the data acquired from sampling when both the real-time updating of the temperature images and the thermal dose estimation are required.

The determination of the temperature changes at the focus of ultrasound can include pre-estimating the temperature changes at the focus of the ultrasound.

In a further embodiment of the invention, the determination of the temperature changes at the focus includes periodically feeding back the temperature values at the focus obtained from the reconstructed image, and predicting the subsequent temperature changes according to the changes of temperature values at the focus over a period of time.

The periodical feedback of the temperature values at the focus obtained from the reconstructed image can include reducing the period of feeding back the temperature values at the focus obtained from the reconstructed images when the temperature values at the focus have larger changes, and increasing the period of feeding back the temperature values at the focus obtained from the reconstructed images when the temperature values at the focus have smaller changes.

The above objects also are achieved in accordance with the present invention by proposes an apparatus for accelerating the MR temperature imaging used in MR-monitored high intensity focused ultrasound (HIFU) therapy, having an acceleration rate determining unit for determining temperature changes at the focus of the ultrasound during MR temperature imaging and determining the ideal acceleration rate needed for data sampling according to the temperature change at the focus, and a signal processing unit for adjusting the variable-density data sampling of k-space according to the ideal acceleration rate determined by the acceleration rate determining unit and for reconstructing the data acquired from sampling to obtain temperature images.

In another embodiment of the invention, the acceleration rate determining unit includes a temperature change determining module for determining the temperature changes at the focus of the ultrasound during MR temperature imaging; and an acceleration rate determining module for determining the ideal acceleration rate needed for data sampling according to the temperature changes determined by the temperature change determining module.

In an embodiment, the signal processing unit includes a data sampling module for adjusting the variable-density data sampling of k-space according to the ideal acceleration rate determined by the acceleration rate determining unit, a data rebuilding module for rebuilding the data acquired by the data sampling module to obtain temperature images.

The apparatus can further include a temperature feedback unit for periodically feeding back the temperature values at the focus measured from the rebuilt images to the acceleration rate determining unit; the acceleration rate determining unit for determining the temperature changes according to the temperature values fed back by the temperature feedback unit over a period of time.

The apparatus can further include a temperature feedback control unit for controlling the period for the temperature feedback unit to feed back the temperature values to the acceleration rate determining unit.

The solution according to the present invention can improve the capability of accelerating MR temperature imaging with both good temporal resolution and good spatial resolution by determining the acceleration rate according to temperature changes at the ultrasound focus and by adjusting the VD data sampling of k-space and thereby offers the benefits of good flexibility, feasibility and stability. In addition, because of the freedom of selecting from two methods for rebuilding data acquired from sampling, it is possible to meet both the real-time requirement and the accuracy requirement of data rebuilding and to achieve the best possible rebuilding results to suit actual needs, making the technical solution of the present invention even more feasible.

DESCRIPTION OF THE PREFERRED EMBODIMENTS

In order to make the objects, technical solution and advantages of the present invention more evident, the following will further explain the present invention in conjunction with the attached drawings and embodiments. It should be understood that the embodiments described herein are only for illustrative purpose and are not intended to limit the present invention.

The solution of accelerating MR temperature imaging according to the present invention is to determine, in the process of temperature imaging, the ideal acceleration rate needed for data sampling according to temperature change at the focus, to adjust the VD data sampling of k-space according to the determined ideal acceleration rate, and to rebuild the data acquired from sampling. It is preferred that the two rebuilding methods are used alternatively to rebuild the sampled data according to different imaging requirements.

Figure 1:
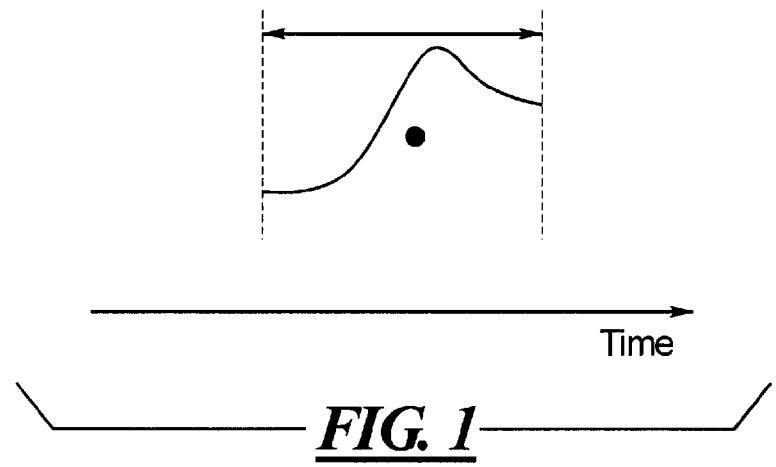
FIG. 1 is a schematic diagram of the temporal averaging effect during MR temperature imaging.
Figure 2:
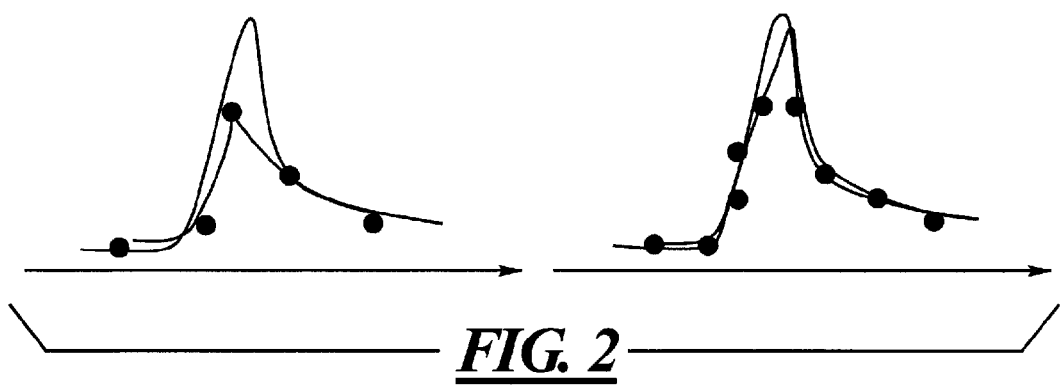
FIG. 2 is an illustration of the impact of the temporal resolution on the capturing temperature changes during MR temperature imaging.
Figure 3:
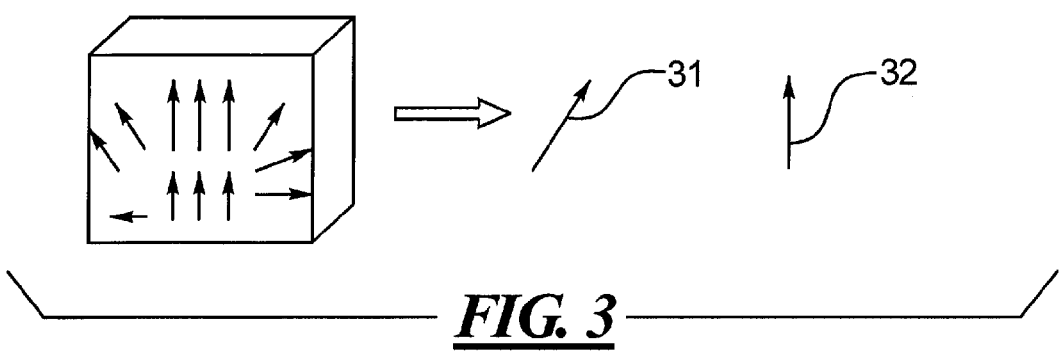
FIG. 3 is an illustration of the spatial averaging effect during MR temperature imaging.
Figure 4:
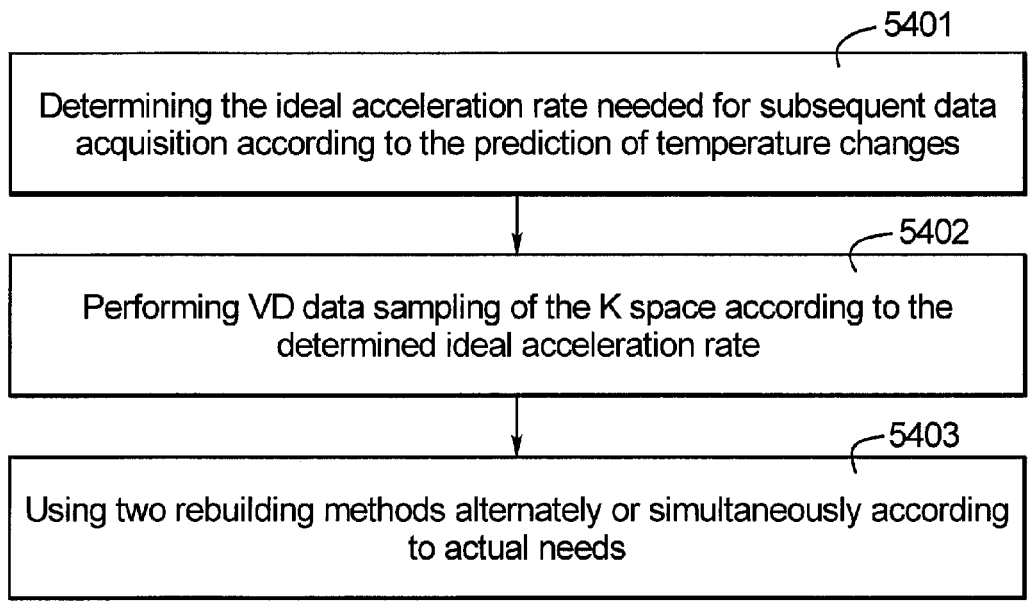
FIG. 4 is a flowchart showing an embodiment of the method for accelerating MR temperature imaging according to the present invention.

FIG. 4 is a flowchart showing an embodiment of the method for accelerating MR temperature imaging according to the present invention. As shown in FIG. 4, in this embodiment the method for accelerating MR temperature imaging mainly comprises the following steps:

Step S401: determining the ideal acceleration rate needed for subsequent data sampling according to the prediction of the temperature changes.

When the ideal acceleration rate for a group of frames can be determined in advance, for example, when the temperature changes can be roughly predicted or controlled, the temperature changes can be estimated in advance, and then a fixed acceleration rate can be determined according to the estimated temperature changes.

The ideal acceleration rate can be determined real-time. For instance, the subsequent temperature changes are predicted by using the calculation of historic temperature changes (e.g. using the echo sharing technique to feedback the temperature value), and then using the temperature value changes over a period of time. The acceleration rate needed for the subsequent data sampling is adjusted adaptively according to the prediction results. This is especially suitable for the purposes of acquiring the curve of temperature changes with a high gradient.

Step S402: performing VD data sampling of k-space according to the determined ideal acceleration rate.

Figure 5:
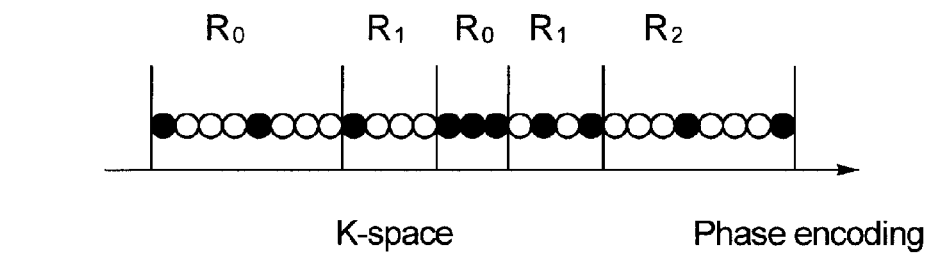
FIG. 5 is an illustration of variable-density sampling of k-space.

Consider first the VD sampling of k-space. K-space is divided into several segments in the phase encoding direction. FIG. 5 is an illustration of VD sampling of k-space. As shown in FIG. 5, k-space is divided into five segments: $R_{-2}, R_{-1}, R_0, R_1, R_2$, and $R_0$ is located at the center of k-space. In $R_{-2}$ and $R_2$, one of the four phase encoding lines is acquired, so the acceleration factor is 4. Similarly, in $R_{-1}$ and $R_1$, the acceleration rate is 2. $R_0$ is fully sampled. The acceleration factor is increased in k-space from inside to outside.

Figure 6:
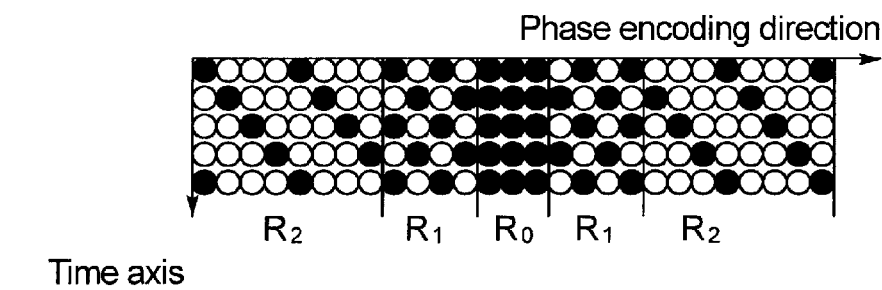
FIG. 6 is an illustration of alternate sampling of the phase encoding in the adjacent frames.

The segment division and the corresponding acceleration factor are adjusted according to the rate of temperature changes. For instance, the phase encoding lines can be further reduced by reducing the size of segments with lower acceleration factors and/or increasing the acceleration factors for the outer segments when the temperature is changing quickly, hence achieving a higher temporal resolution. By contrast, when the temperature is changing slowly, the opposite adjustment can achieve higher SNR (or higher quality of rebuilt images). If the same k-space VD sampling mode is applied in several sequential frames, the phase encoding lines in these frames can be sampled alternately. FIG. 6 shows an example of the alternate sampling. As shown in FIG. 6, the lateral axis is the phase encoding direction, the longitudinal axis is the time axis, and the signals sampled from the phase encoding lines in the sequential frames on the time axis are arranged alternately.

Step S403: using the two rebuilding methods alternately or simultaneously for rebuilding according to actual needs to obtain temperature images.

Firstly, the Inverse Discrete Fourier Transform (IDFT) can be applied in the frequency encoding direction of k-space, and then the phase encoding lines which contain the area of interest are selected for rebuilding. This will prevent reconstruction of the whole image to save a considerable amount of unnecessary work.

The two reconstruction methods include the echo sharing technique and Iterative K-t technique.

The echo sharing technique is to share data within the adjacent sequential frames for use when real-time updating of temperature images and/or temperature feedback is needed. The echo sharing technique can have a quick rebuilding but the accuracy of the rebuilding is low. The iterative K-t technique can provide a higher accuracy in reconstruction. When the thermal dose estimation is required, the iterative K-t technique can help to make accurate thermal dose estimation, but has a very low calculation speed. Because the two techniques are mutually complementary, a proper selection from the two techniques or a combination of the two techniques will offer a high performance. The selection of the two reconstruction methods is determined by calculation workload. If the iterative K-t technique cannot complete the task in a given time, then the echo sharing technique is a better choice. It should be understood that if both real-time updating of temperature images and accurate rebuilding are required at the same time, the two techniques can be used simultaneously for rebuilding and the combination of the two techniques can provide even higher performance.

In addition, the temperature control mechanism can be introduced into the present invention and variable feedback rates can be achieved by controlling the ideal acceleration rate for the specific frames through a temperature control mechanism. For instance, on the ascending edge of the temperature changes with higher gradients, fast feedback is needed to avoid serious overshoot. At this time, the temperature control mechanism can freely adjust the rate of temperature feedback to optimize performance by setting the acceleration rate.

Figure 7:
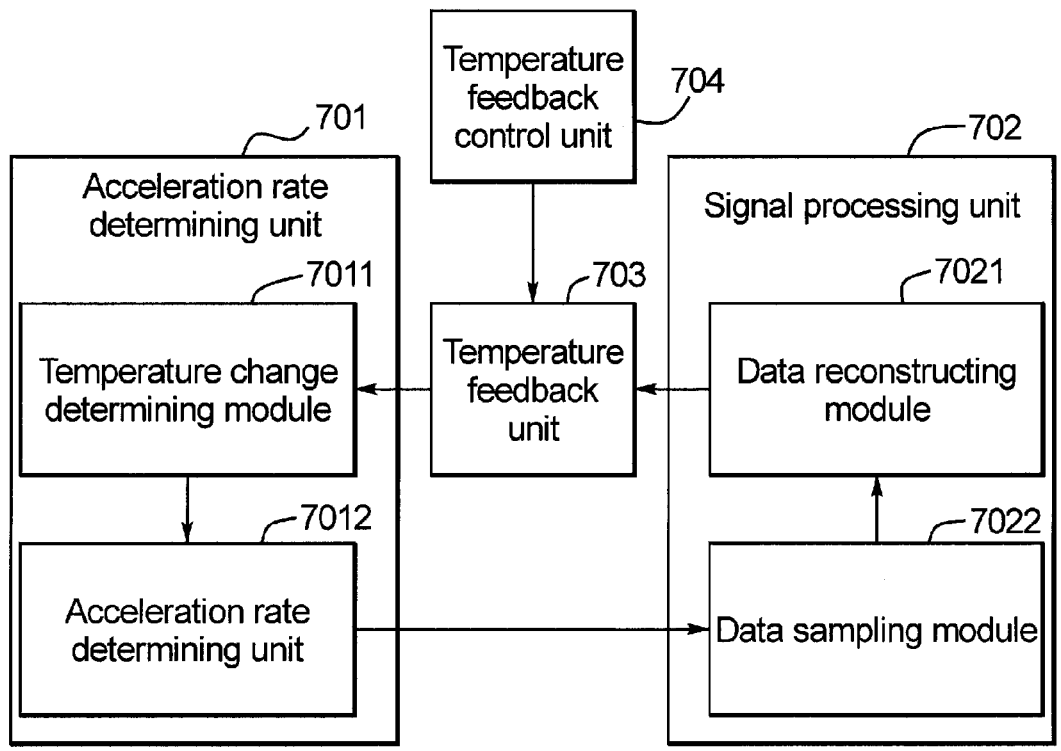
FIG. 7 is a diagram showing the structure of an embodiment of the apparatus for accelerating MR temperature imaging according to the present invention.

FIG. 7 is a diagram showing the structure of an embodiment of the apparatus for accelerating MR temperature imaging according to the present invention. It can be seen from FIG. 7 that in this embodiment the apparatus for accelerating MR temperature imaging primarily comprises an acceleration rate determining unit 701 and a signal processing unit 702.

The acceleration rate determining unit 701 determines temperature changes at the focus of the ultrasound during MR temperature imaging and then determines the ideal acceleration rate needed for data sampling according to the temperature changes at said focus; the signal processing unit 702 adjusts the variable-density data sampling of k-space according to the ideal acceleration rate determined by the acceleration rate determining unit 701 and rebuilds the data acquired from sampling to obtain temperature images.

The acceleration rate determining unit 701 comprises a temperature change determining module 7011 and an acceleration rate determining module 7012, wherein the temperature change determining module 7011 determines the temperature changes at the focus of the ultrasound during MR temperature imaging; the acceleration rate determining module 7012 determines the ideal acceleration rate needed for data sampling according to the temperature changes determined by the temperature change determining module 7011.

The signal processing unit 702 comprises a data sampling module 7021 and a data rebuilding module 7022, wherein the data sampling module 7021 adjusts the VD data sampling of k-space according to the ideal acceleration rate determined by the acceleration rate determining unit 701; the data rebuilding module 7022 reconstructs the data acquired by the data sampling module 7021 to obtain temperature images.

Preferably, the apparatus further comprises a temperature feedback unit 703 for periodically feeding the temperature values at the focus measured from the reconstructed images back to the acceleration rate determining unit 701; the acceleration rate determining unit 701 determines the temperature changes according to the temperature values fed back by the temperature feedback 703 unit over a period of time.

Preferably, the apparatus further includes a temperature feedback control unit 704 for controlling the period for the temperature feedback unit 703 to feed back the temperature values to the acceleration rate determining unit 701. The solution of the present invention has the following advantages.

High acceleration capability: by using redundancy the K-t space and by combining the iterative K-t technique, the present accelerating method can achieve a higher acceleration rate than other methods, which target only at k-space or time domain, while keeping the spatial resolution unchanged;

High flexibility: if the same k-space sampling mode is applied to both the time of quick temperature changes and that of slow temperature changes, one or both of the two problems may occur. The time accuracy may not be high enough to effectively capture the temperature curve, or unnecessary SNR losses or accuracy losses may be present in the reconstructed images due to over-acceleration during the time of slow temperature changes. The VD sampling mode adopted in the solution of the present invention can adaptively adjust the acceleration rate according to the temperature changes. Compared with existing parallel imaging technology, the present invention can provide continuously changing acceleration rates, so as to avoid any large fluctuation in the rebuilding accuracy caused by adjustment of the acceleration rate. Feasibility: flexibly combining the two rebuilding methods makes the present invention even feasible. The echo sharing technique is suitable for real-time updating but has a lower accuracy. Because the iterative K-t technique requires a large amount of frames in a single rebuilding, the calculation loads are too large for real-time monitoring. However, the iterative K-t technique can provide more accurate rebuilt images than the echo sharing technique. The VD sampling mode and the combination of the two reconstruction methods make the present invention even more feasible;

High stability: in clinical care application, the stability is critical during ultrasonic heating monitoring. Usually, most of the energy representing the change signals is focused at the center of k-space in the dynamic imaging, therefore the data from the center part plays a special role in stable and accurate rebuilding. However, some parallel imaging techniques sample from the uniform k-space. Improper alignment may result in serious residual artifacts in the rebuilt images. Unlike these technologies, the solution of the present invention is flexible in k-space sampling modes. By performing more variable-density sampling at the center of k-space, the solution of the present invention can eliminate the serious residual artifacts in the reconstructed image as compared with the existing solutions, so as to provide more accurate, stable results.

Figure 8:
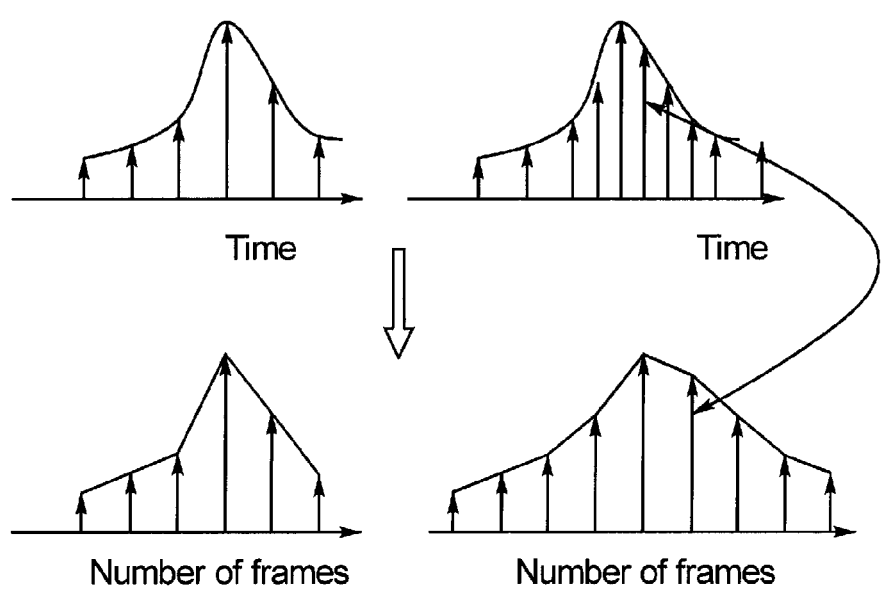
FIG. 8 shows how to compensate for the K-t correlativity through variable sampling in the time domain space when the temperature is changing quickly.

High K-t correlativity: unlike the uniform sampling of time domain space, in the VD sampling mode, the temporal resolution can be changed according to the speed of temperature changes so the decreasing K-t correlativity due to the quick temperature changes can be compensated by increasing the temporal resolution, which helps further improve the accuracy. FIG. 8 shows how to compensate the K-t correlativity with the variable sampling of the time domain space when the temperature is changing quickly. In FIG. 8, the top left curve shows the curve of uniform sampling and the bottom right curve shows the temperature sequence obtained from uniform sampling of the time domain; the top right curve is the curve of VD sampling of the time domain and the bottom right curve shows the temperature sequence obtained from VD sampling of the time domain. It can be seen by comparing the uniform sampling with the VD sampling of the time domain as shown in FIG. 8, that the changing rate of the temperature sequence is decreased by using the VD sampling of the time domain due to improved temporal resolution.

Improvement in the temperature control mechanism: the VD sampling provides a controllable feedback rate for the temperature controller to improve its performance while receiving quick temperature changes. The temperature controller can freely adjust the feedback rate to suit specific purposes although it is necessary to balance the accuracy and speed.

The following describes the results from simulation testing of the present invention.

Temperature Model:

Extracting the temperature changes from the phase image:

$$\Delta T(x, y) = \frac{\Delta \phi(x, y)}{\delta \cdot \gamma \cdot B_0 \cdot TE} \quad (1)$$

wherein, $\Delta T(x, y)$ is the temperature change, $\Delta \phi(x, y)$ is the relative phase change in two frames in MR images, $\delta$ is a constant, $\delta = -0.01$ ppm/° C., $\gamma$ is the susceptibility factor, BO is the magnetostatic field strength, and TE is the time for echo of temperature sequence.

Spatial distribution model of temperature:

$$\Delta T(x, y, t) = f(t) \cdot \left( e^{-\left(\frac{x-x0}{\sigma_x}\right)^2 - \left(\frac{y-y0}{\sigma_y}\right)^2} \right) \quad (2)$$

wherein, f(t) is the function of temperature changes at the focus of the ultrasound. For simplicity, σx and σy are set as constant in the process of heating.

Figure 9:
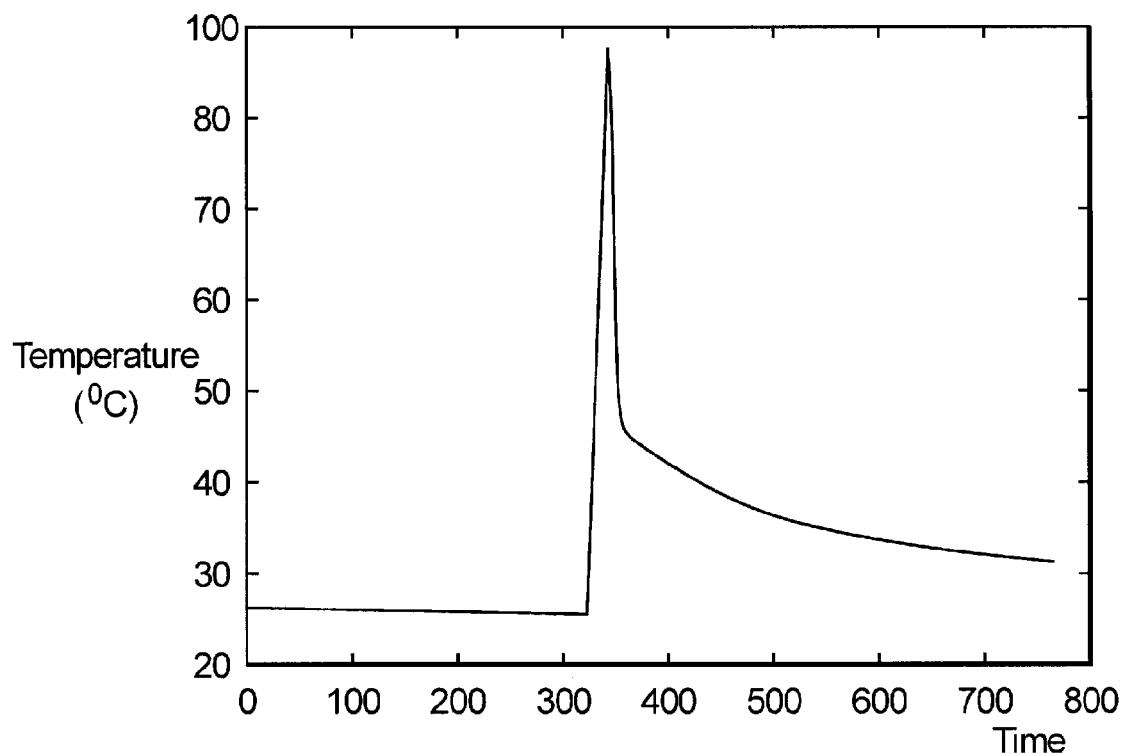
FIG. 9 shows a curve of temperature changes in an actual HIFU heating process measured with an optical fiber thermometer.

722 temperature values adjacent to the measured focus are measured by using an optical fiber thermometer during the ultrasound heating process of HIFU. The sampling rate is one sample per second. FIG. 9 shows a curve of temperature changes measured by an optical fiber thermometer during the HIFU heating. The parameters of the fGRE sequence used are: TR=70 ms, TE=10 ms. This means that only 14 phase encoding steps can be applied and a total of 722×14 phase encoding steps are applied in 722 seconds. When the phase encoding is applied, each datum after the linear interpolation represents an approximate temperature value and these data are used as f(t) after the interpolation.

Figure 10:
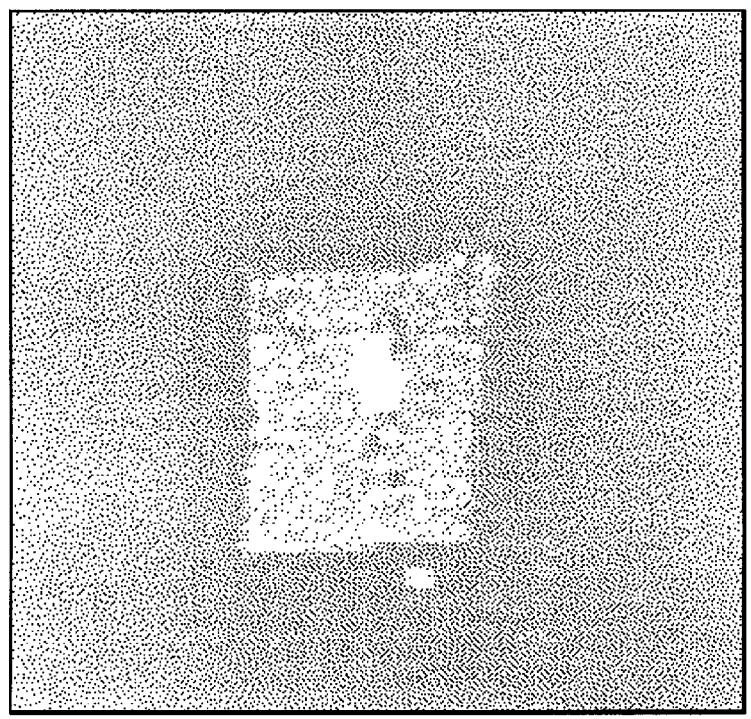
FIG. 10 shows a heated image of the simulated bovine liver in a simulation test.

Simulation Heating Area:

The MR image of bovine liver in water collected by the fGRE temperature sequence is used as a reference. The changing spatial temperature profile calculated by equation (2) is transformed by equation (1) to phase profile and overlapped on the MR image to simulate the heating process. FIG. 10 shows a heating image. These images are converted by Discrete Fourier Transform (DFT) to raw data. The rectangle at the center of FIG. 10 is the bovine liver, which is surrounded by water which has relatively low-density signals. The simulation heating area is located at the center of the bovine liver indicated by the arrow.

Several Hypotheses:

a) The temperature is not changed when acquiring a single phase encoding line, therefore the body model has a total of 722×14 status in 722 seconds. The phase information in the heating area can be calculated reversely from the temperature;

b) The image matrix is 256×256, meaning 256 phase encoding lines are needed for full sampling.

The purpose of the simulation test is to examine how the temporal resolution influences the capture capability of quick temperature changes as well as the feasibility of alternate utilization of echo sharing and the iterative K-t technique.

Figure 11:
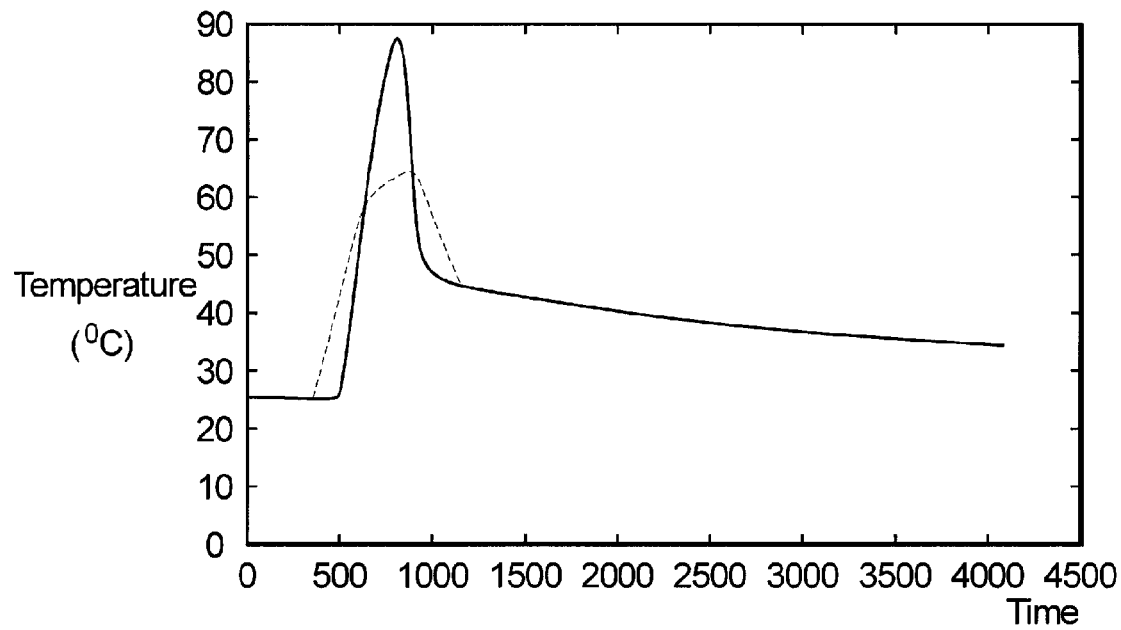
FIG. 11 is an illustration of captured temperature change results acquired by using k-space full sampling mode in a simulation test.

When performing simulation, the full sampling of k-space is conducted to verify the capability of temperature changes (by acquiring a total of 16 frames, 4096 phase encoding lines), and the simulation results are displayed in FIG. 11.

In FIG. 11, the wider solid line represents the real temperature changes; the thinner solid line represents the time point at which the center of k-space is sampled, the dotted line represents the temperature measured, which is fitted by the linear interpolation of 16 temperature values obtained from rebuilding the data of 16 frames acquired by sampling.

Several findings can be concluded from FIG. 11: a) the value measured in rebuilding the MR image approximates the temperature value from sampling k-space; b) due to low temporal resolution, the fast change curve cannot be captured, such as the difference between thick solid line and dotted line.

Figure 12:
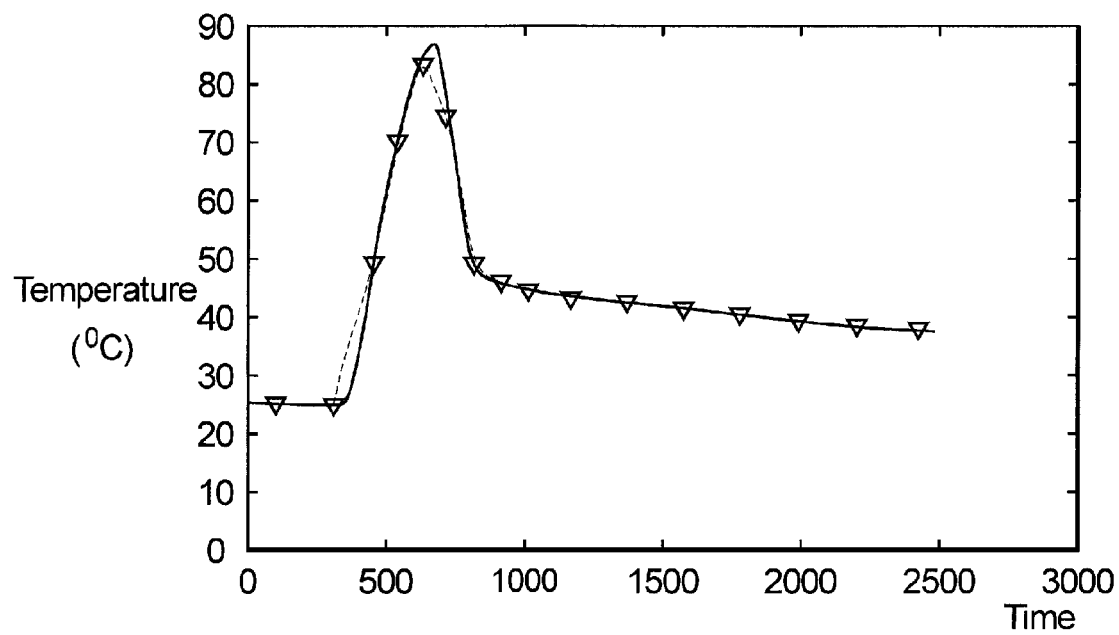
FIG. 12 is an illustration of captured temperature change results acquired by using the variable-density sampling mode in a simulation test.

According to the solution of the present invention, the adaptive VD sampling is applied to the temperature change captured (a total of 16 frames, 2516 phase encoding lines). FIG. 12 shows the simulation results.

In FIG. 12, the wider solid line represents real temperature changes, the thinner solid line represents the time point at which the center of k-space is sampled, and the triangle and dotted line represent the measured temperatures wherein the triangle represents the temperature measured in the images rebuilt by the echo sharing technique, the dotted line represents the temperature measured in the image rebuilt by the iterative K-t technique.

By comparing FIG. 12 and FIG. 11, both sampling modes achieve high quality in images, and the VD sampling of the present invention can adaptively adjust temporal resolution to capture the fast temperature changes, but the full sampling mode loses such information. FIG. 12 also demonstrates the feasibility and accuracy of the rebuilding method proposed by the present invention.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for accelerating magnetic resonance (MR) temperature imaging for monitoring high intensity focused ultrasound (HIFU) therapy, comprising the steps of:
    conducting a HIFU therapy procedure on a subject situated in an MR imaging apparatus, by emitting high intensity focused ultrasound into the subject from a focus;
    operating said MR imaging apparatus in an MR temperature imaging sequence to determine temperature changes at said focus during said HIFU therapy procedure, said MR temperature imaging sequence including acquiring MR temperature imaging data and entering said data into k-space by sampling k-space with a variable density;
    automatically electronically determining an ideal acceleration rate for said sampling of k-space dependent on said temperature changes at said focus;
    adjusting said variable density sampling of k-space according to the determined ideal acceleration rate; and
    reconstructing a temperature image of the subject from the MR temperature imaging data entered into k-space.

2. A method as claimed in claim 1 comprising automatically electronically determining said ideal acceleration rate by determining a higher rate for use as said ideal acceleration rate when said temperature changes quickly at said focus, and determining a lower rate for use as said ideal acceleration rate when the temperature is changing slowly at said focus.

3. A method as claimed in claim 1 comprising executing said MR temperature imaging sequence with phase coding in a phase coding direction, and electronically dividing k-space into a plurality of segments in a same direction as said phase coding direction, and adjusting the variable density sampling of k-space according to the ideal acceleration rate by adjusting the segmentation of k-space for variable density sampling and also adjusting respective acceleration factors for sampling the respective segments, dependent on said ideal acceleration rate.

4. A method as claimed in claim 3 comprising adjusting said segmentation and said acceleration factor by, when the temperature at said focus is changing quickly, making an adjustment selected from the group consisting of reducing respective sizes of segments having lower acceleration factors and increasing the respective acceleration factors for outer segments of k-space and, when the temperature at said focus is changing slowly, making an adjustment selected from the selected from the group consisting of increasing respective sizes of segments having lower acceleration factors and reducing the respective acceleration factors for outer segments of k-space.

5. A method as claimed in claim 3 comprising implementing said MR temperature imaging sequence with phase coding in a phase coding direction, and adjusting the variable density sampling of k-space dependent on the ideal acceleration rate by, if a same ideal acceleration rate is applied for multiple repetitions of said MR temperature imaging sequence, alternatingly sampling phase coding lines in k-space in said multiple repetitions.

6. A method as claimed in claim 1 comprising implementing said MR temperature imaging sequence with frequency coding in a frequency coding direction and phase coding in a phase coding direction, and comprising applying an inverse discrete Fourier transform in the frequency coding direction of k-space and select phase coding lines in k-space containing an area of interest for image reconstruction before reconstructing said temperature image, and reconstructing the temperature image from data in said phase coding lines in k-space in said area of interest.

7. A method as claimed in claim 1 comprising reconstructing said temperature image using an image reconstruction technique selected from the group consisting of echo sharing technique and iterative K-t techniques.

8. A method as claimed in claim 7 comprising using said echo sharing technique to reconstruct said temperature image when real-time updating of said temperature image is required, and using iterative K-t techniques to reconstruct said temperature image when thermal dose estimation is required, and using both said echo sharing technique and an iterative K-t technique to reconstruct said temperature image when both real time updating and thermal dose estimation are required.

9. A method as claimed in claim 1 comprising automatically determining said temperature changes at said focus by re-estimating said temperature changes at said focus, before implementing said HIFU therapy procedure.

10. A method as claimed in claim 1 comprising automatically electronically determining said temperature changes at said focus by periodically feeding back temperature values at said focus obtained from said reconstructed temperature image, and automatically predicting subsequent changes of said temperature at said focus based on said temperature values over a period of time.

11. A method as claimed in claim 10 comprising reducing a period of feeding back said temperature values when said temperature values at said focus exhibit larger changes, and increasing the period of feeding back said temperature values at said focus when said temperature values at said focus exhibit smaller changes.

12. An apparatus for accelerating magnetic resonance (MR) temperature imaging during MR-monitored HIFU therapy wherein an HIFU therapy head emits high intensity focused ultrasound into a subject from a focus, and wherein MR temperature image data are acquired for entry into k-space by variable-density sampling of k-space, said apparatus comprising:

an acceleration rate determining unit that determines temperature changes at said focus during said HIFU therapy and that determines an ideal acceleration rate for sampling k-space dependent on said temperature changes; and a signal processor that adjusts the variable density sampling of k-space dependent on said ideal acceleration rate, and that reconstructs a temperature image from the MR temperature data entered into k-space.

13. An apparatus as claimed in claim 12 wherein said acceleration rate determining unit comprises a temperature change determining module that determines said temperature changes at said focus, and an acceleration rate determining module that determines said ideal acceleration rate dependent on the temperature changes determined by the temperature change determining module.

14. An apparatus as claimed in claim 12 wherein said signal processing unit comprises a data sampling module that adjusts said variable density sampling of k-space dependent on said ideal acceleration rate, and an image reconstruction module that reconstructs said temperature image from said data in k-space.

15. An apparatus as claimed in claim 12 comprising a temperature feedback unit that periodically feeds back said temperature values at said focus, obtained from said reconstructive temperature image, to said acceleration rate determining unit, and wherein said acceleration rate determining unit determines said temperature change from said temperature values.

16. An apparatus as claimed in claim 15 comprising a temperature feedback control unit that controls a period during which said temperature feedback unit feeds back said temperature values to said acceleration rate determining unit.

* * * * *